US008879331B2

(12) United States Patent
Sel et al.

(10) Patent No.: US 8,879,331 B2
(45) Date of Patent: Nov. 4, 2014

(54) SHARED BIT LINE STRING ARCHITECTURE

(71) Applicant: Sandisk Technologies Inc., Plano, TX (US)

(72) Inventors: Jongsun Sel, Los Gatos, CA (US);
Seungpil Lee, San Ramon, CA (US);
Kwang-Ho Kim, Pleasanton, CA (US);
Tuan Pham, San Jose, CA (US)

(73) Assignee: Sandisk Technologies Inc., Plano, TX (US)

( * ) Notice: Subject to any disclaimer, the term of this patent is extended or adjusted under 35 U.S.C. 154(b) by 0 days.

(21) Appl. No.: 13/797,298

(22) Filed: Mar. 12, 2013

(65) Prior Publication Data
US 2014/0269100 A1 Sep. 18, 2014

(51) Int. Cl.
*G11C 11/34* (2006.01)
*G11C 16/24* (2006.01)

(52) U.S. Cl.
CPC ........................................ *G11C 16/24* (2013.01)
USPC ................................. 365/185.24; 365/185.17

(58) Field of Classification Search
USPC ............................ 365/185.24, 185.17, 185.18
See application file for complete search history.

(56) References Cited

U.S. PATENT DOCUMENTS

| 6,028,788 | A | 2/2000 | Choi |
| 6,091,633 | A | 7/2000 | Cernea |
| 6,151,249 | A | 11/2000 | Shirota |
| 6,620,683 | B1 | 9/2003 | Lin |
| 7,169,624 | B2 | 1/2007 | Hsu |
| 7,170,793 | B2 | 1/2007 | Guterman |
| 7,237,074 | B2 | 6/2007 | Guterman |
| 7,244,984 | B2 | 7/2007 | Kamigaichi |
| 7,286,406 | B2 | 10/2007 | Lutze |
| 7,295,478 | B2 | 11/2007 | Wan |
| 7,508,714 | B2 | 3/2009 | Fasoli |
| 7,719,902 | B2 | 5/2010 | Dong |
| 8,130,556 | B2 | 3/2012 | Lutze |
| 2007/0247912 | A1* | 10/2007 | Kamigaichi et al. ..... 365/185.17 |
| 2009/0302472 | A1 | 12/2009 | Yoon |
| 2010/0046290 | A1 | 2/2010 | Park |
| 2010/0097862 | A1 | 4/2010 | Kang |
| 2012/0014184 | A1 | 1/2012 | Dutta |
| 2012/0147676 | A1 | 6/2012 | Mokhlesi |

OTHER PUBLICATIONS

U.S. Appl. No. 13/107,686, filed May 13, 2011, by Mokhlesi.

(Continued)

*Primary Examiner* — Huan Hoang
(74) *Attorney, Agent, or Firm* — Vierra Magen Marcus LLP

(57) ABSTRACT

Methods for programming and reading memory cells using a shared bit line string architecture are described. In some embodiments, memory cells and select devices may correspond with transistors including a charge storage layer. In some cases, the charge storage layer may be conductive (e.g., a polysilicon layer as used in a floating gate device) or non-conductive (e.g., a silicon nitride layer as used in a SONOS device). In some embodiments, selection of a memory cell in a first string of a pair of strings may include setting an SEO transistor into a conducting state and setting an SGD line controlling drain-side select transistors to a voltage that is greater than a first threshold voltage associated with a first drain-side select transistor of the first string and less than a second threshold voltage associated with a second drain-side select transistor of a second string of the pair of strings.

20 Claims, 13 Drawing Sheets

(56) References Cited

OTHER PUBLICATIONS

U.S. Appl. No. 61/561,286, filed Nov. 18, 2011, by Mokhlesi.
U.S. Appl. No. 13/429,851, filed Mar. 26, 2012, by Chan.
PCT International Search Report dated May 27, 2014, PCT Patent Application No. PCT/US2014/019734.
PCT Written Opinion of the International Searching Authority dated May 27, 2014, PCT Patent Application No. PCT/US2014/019734.

* cited by examiner

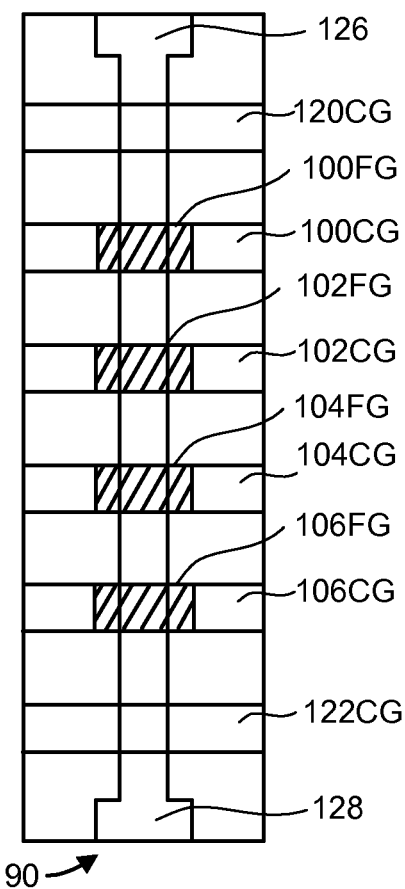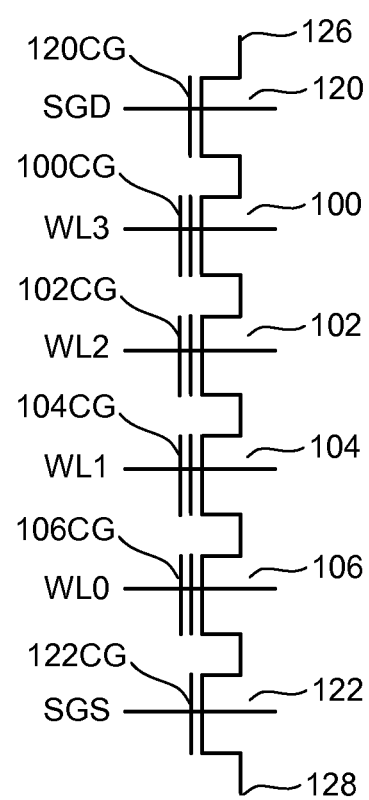
FIG. 1 (Prior Art)
FIG. 2 (Prior Art)

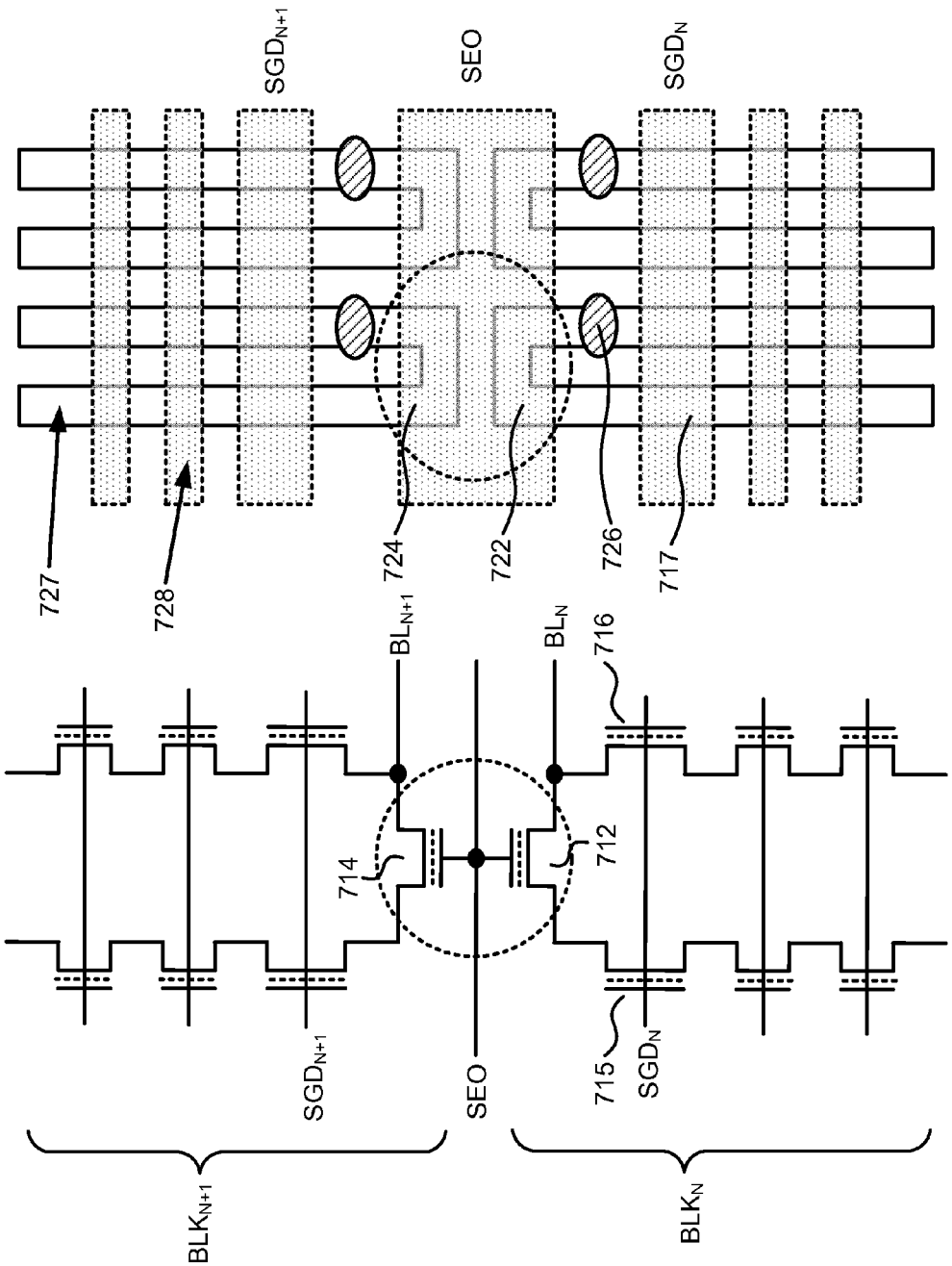

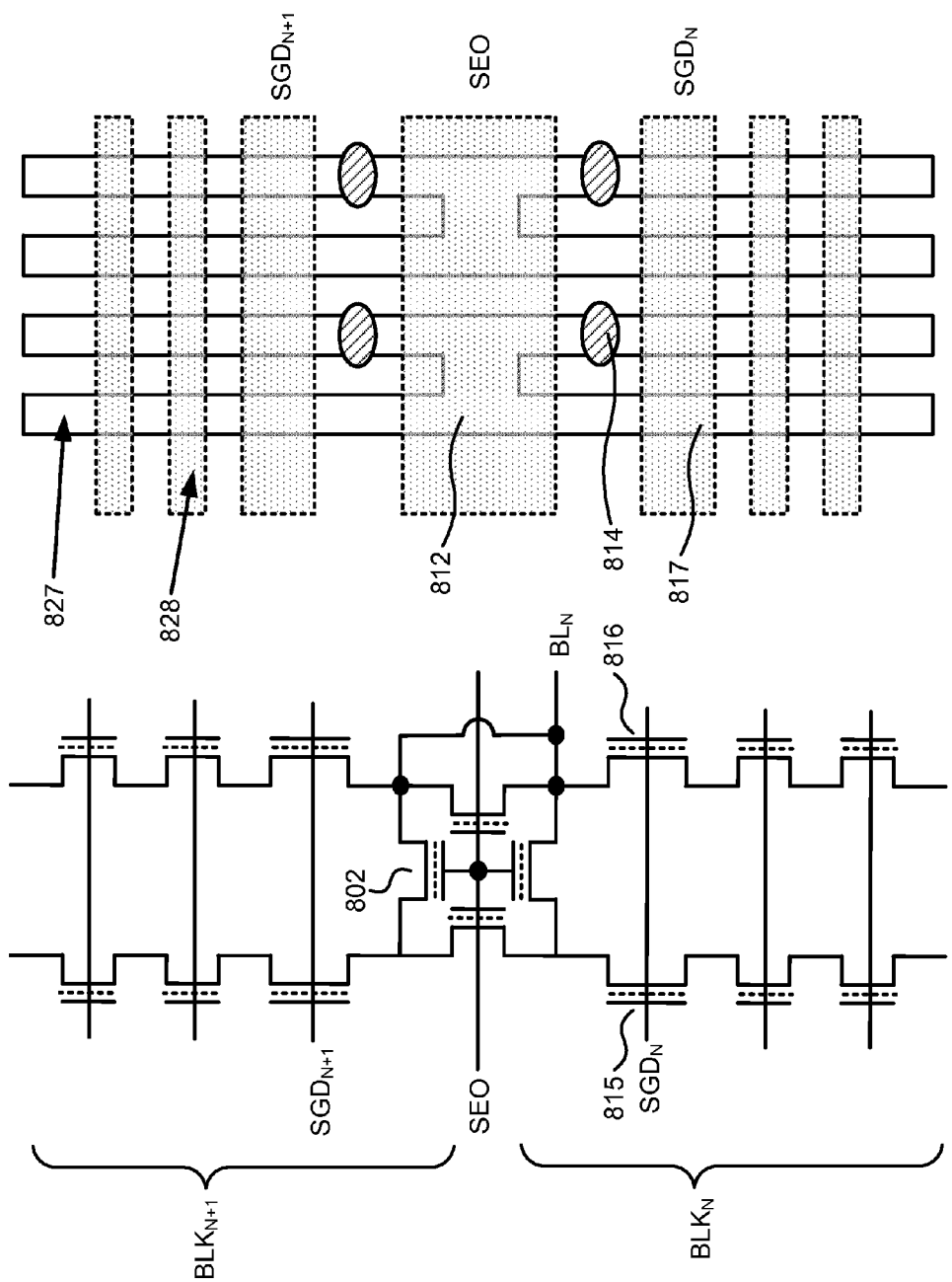

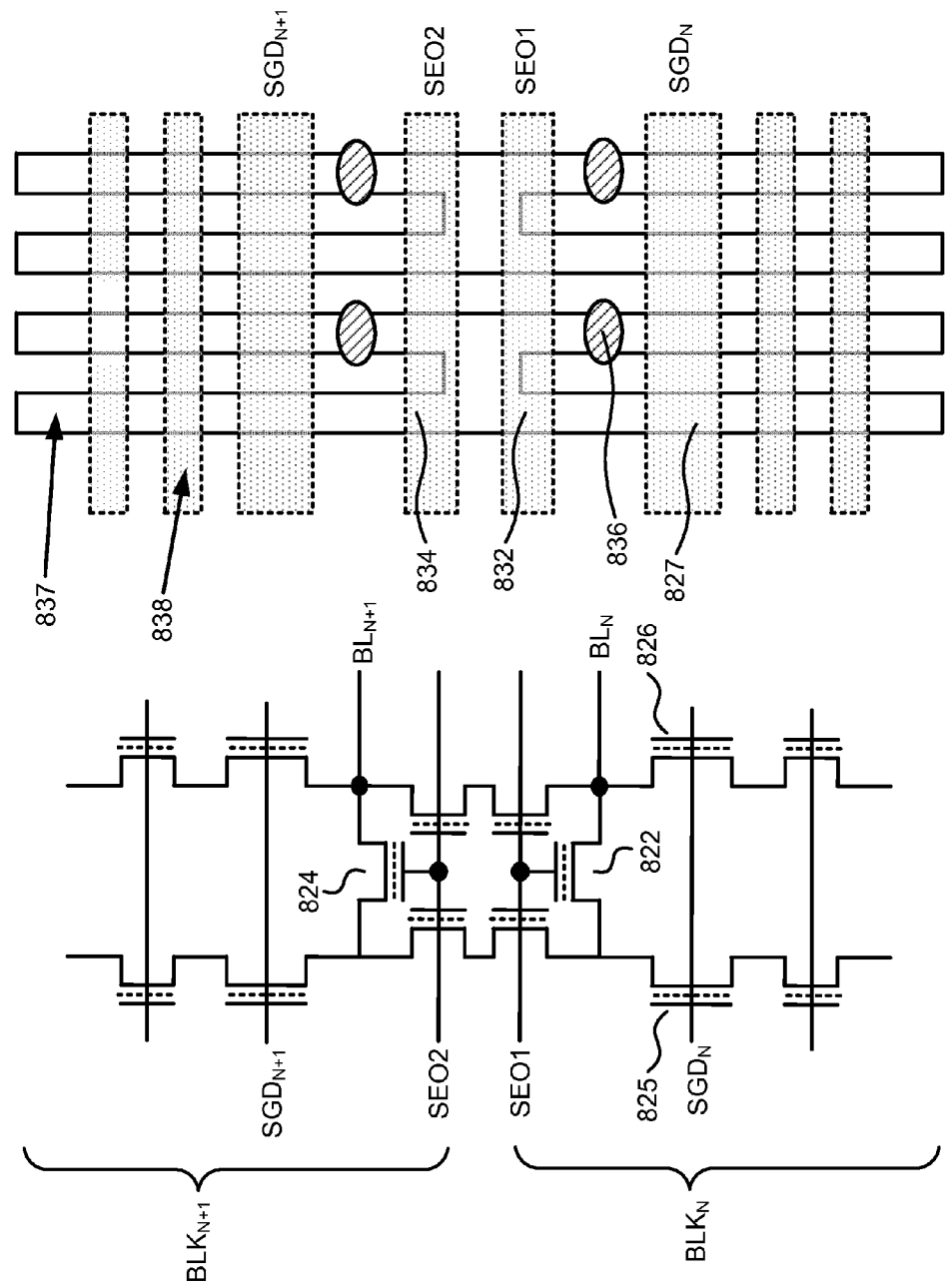

SHARED BIT LINE STRING ARCHITECTURE

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim tunneling or hot-electron injection. The ability to adjust the threshold voltage allows a floating-gate transistor to act as a non-volatile storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates may be referred to as a NAND string. In recent years, NAND flash memory has been scaled in order to reduce cost per bit. However, as process geometries shrink, many design and process challenges are presented. These challenges include increased difficulty with forming tightly spaced bit line contacts.

BRIEF DESCRIPTION OF THE DRAWINGS

FIG. 1 depicts one embodiment of a NAND string.

FIG. 2 depicts one embodiment of the NAND string of FIG. 1 using a corresponding circuit diagram.

FIG. 7B depicts one embodiment of a shared bit line string architecture including a first pair of strings and a second pair of strings.

FIG. 7C depicts one embodiment of a portion of a physical layout for the shared bit line string architecture depicted in FIG. 7B.

FIG. 8A depicts one embodiment of a shared bit line string architecture including a first pair of strings and a second pair of strings.

FIG. 8B depicts one embodiment of a portion of a physical layout for the shared bit line string architecture depicted in FIG. 8A.

FIG. 8C depicts another embodiment of a shared bit line string architecture including a first pair of strings and a second pair of strings.

FIG. 8D depicts one embodiment of a portion of a physical layout for the shared bit line string architecture depicted in FIG. 8C.

DETAILED DESCRIPTION

Figure 3A:
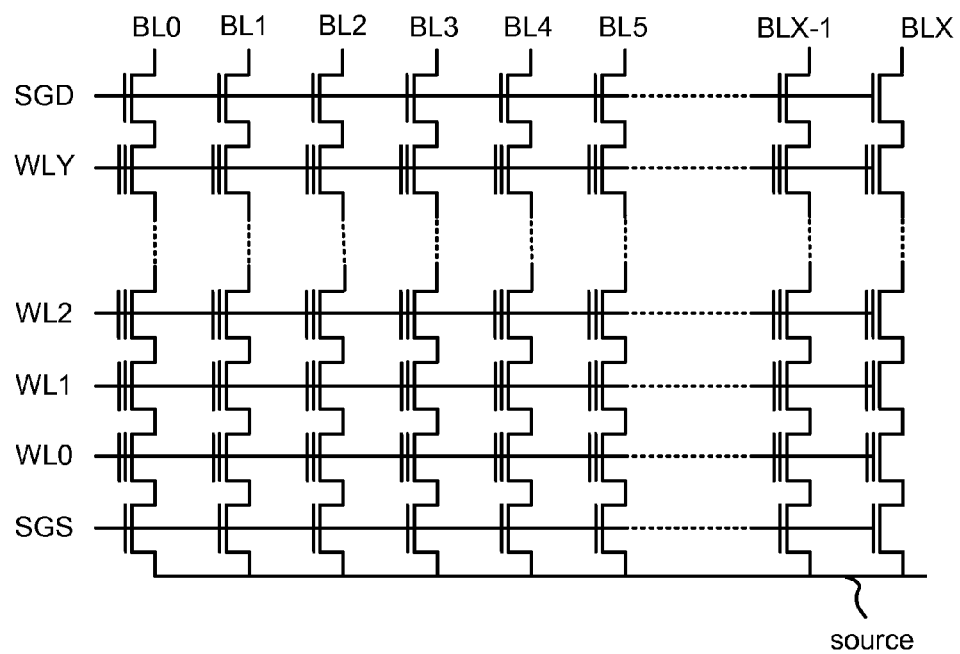
FIG. 3A depicts one embodiment of a memory block including a plurality of NAND strings.

Technology is described for programming and reading memory cells using a shared bit line string architecture. In some embodiments, both memory cells and select devices may utilize the same transistor structure. In one example, both memory cells and select devices (e.g., a drain-side select device) may correspond with transistors including a charge storage layer. In some cases, the charge storage layer may be conductive (e.g., a polysilicon layer as used in a floating gate device) or non-conductive (e.g., a silicon nitride layer as used in a SONOS device). The shared bit line string architecture may include one or more string pairs in a memory block. The memory cells associated with the one or more string pairs may correspond with floating-gate devices or charge trapping devices. In some embodiments, the selection of memory cells in a first string of a pair of strings may include setting a selection even/odd string transistor (SEO transistor) into a conducting state and setting an SGD line controlling drain-side select transistors to a voltage that is greater than a first threshold voltage associated with a first drain-side select transistor of the first string and less than a second threshold voltage associated with a second drain-side select transistor of a second string of the pair of strings.

One issue involving the use of a shared bit line string architecture is that the spacing between transistors in a string may make it difficult to fabricate closely spaced transistors that have different transistor threshold voltages (e.g., via ion implantation). Another issue is that for some non-volatile transistor structures (e.g., those using a thin charge storage layer), the fabrication of select transistors using an etching IPD (EI) contact to effectively short a control gate layer to a charge storage layer may be difficult to achieve. Thus, there is a need to program and read memory cells in a shared bit line string architecture without requiring additional processing steps for forming select transistors.

One benefit of a shared bit line string architecture (e.g., a shared bit line string architecture comprising NAND flash memory cells or SONOS memory cells) is that it relieves the bit line pitch by 2× since pairing strings with a common bit line allows the total number of bit lines to be cut in half. The increase in bit line pitch for a given process geometry allows for less resistive bit line contacts and the reduced total number of bit lines allows for reduced bit line resistance and/or reduced bit line to bit line capacitance between adjacent bit lines. These benefits, however, come at the expense of reduced controllability of each string. For example, during a programming operation only one string of a pair of strings may be programmed via the common bit line at a particular time. More information regarding a shared bit line memory architecture using NAND flash memory cells may be found in U.S. Provisional Application 61/561,286, "Improved Operation for Non-Volatile Storage System With Shared Bit Lines Connected to Single Selection Device," U.S. Provisional Application 61/422,385, "Non-Volatile Storage System With Shared Bit Lines Connected to Single Selection Device," and U.S. patent application Ser. No. 13/429,851, "Shared-Bit-Line Bit Line Setup Scheme," all of which are herein incorporated by reference in their entirety.

FIG. 1 depicts one embodiment of a NAND string 90. FIG. 2 depicts one embodiment of the NAND string of FIG. 1 using a corresponding circuit diagram. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string 90 to a bit line 126. Select gate 122 connects the NAND string 90 to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

Although technology using NAND-type flash memory is described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

FIG. 3A depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may be fabricated using the technology described herein.

In some embodiments, in order to save space on a semiconductor die, two adjacent NAND strings (or other grouping in memory cells) may share a common bit line (i.e., a shared-bit-line memory architecture). In some cases, more than two NAND strings may share a common bit line. In one example, the signal SGD may be replaced by two drain-side selection signals SGD1 and SGD2. Each NAND string of the pair would then have two drain-side select gates, each connected to a different drain-side selection signal of the two drain side selection signals SGD1 and SGD2. One of the two drain-side select gates for each NAND string may be a depletion mode transistor with its threshold voltage lower than 0 volts. One potential problem with using two select gates on the drain side of each NAND string is that two drain-side select gates (as compared to one drain-side select transistor) requires more area on the die. Therefore, from an integrated circuit area standpoint, it may be beneficial to only use one drain-side selection gate for each NAND string and then connect each NAND string of the pair with only one of the two drain-side selection signals.

In one embodiment, when programming a memory cell, such as a NAND flash memory cell, a program voltage may be applied to the control gate of the memory cell and the corresponding bit line may be grounded. These programming bias conditions may cause electrons to be injection into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed.

In one embodiment, memory cells may be erased by raising the p-well to an erase voltage (e.g., 20 volts) for a sufficient period of time and grounding the word lines of a selected block of memory cells while the source and bit lines are floating. These erase bias conditions may cause electrons to be transferred from the floating gate through the tunneling oxide, thereby lowering the threshold voltage of the memory cells within the selected block. In some cases, an erase operation may be performed on an entire memory plane, on individual blocks within a memory plane, or another unit of cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

Figure 3B:
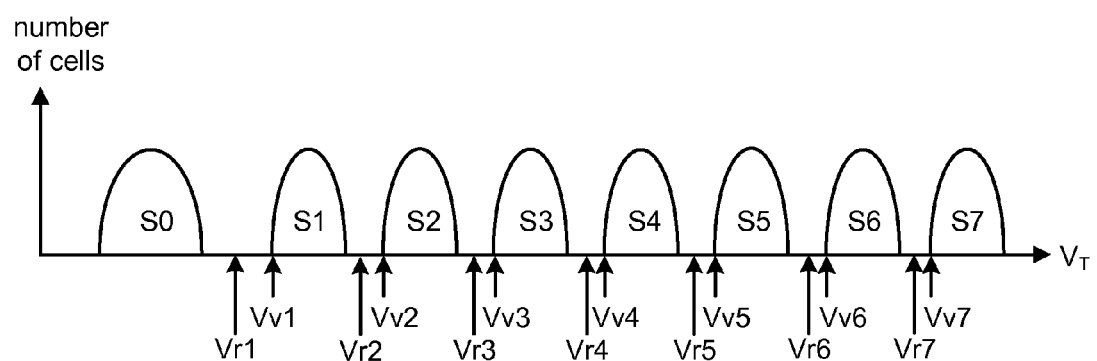
FIG. 3B depicts one embodiment of possible threshold voltage distributions (or data states) for a three-bit-per-cell memory cell.

FIG. 3B depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 4A:
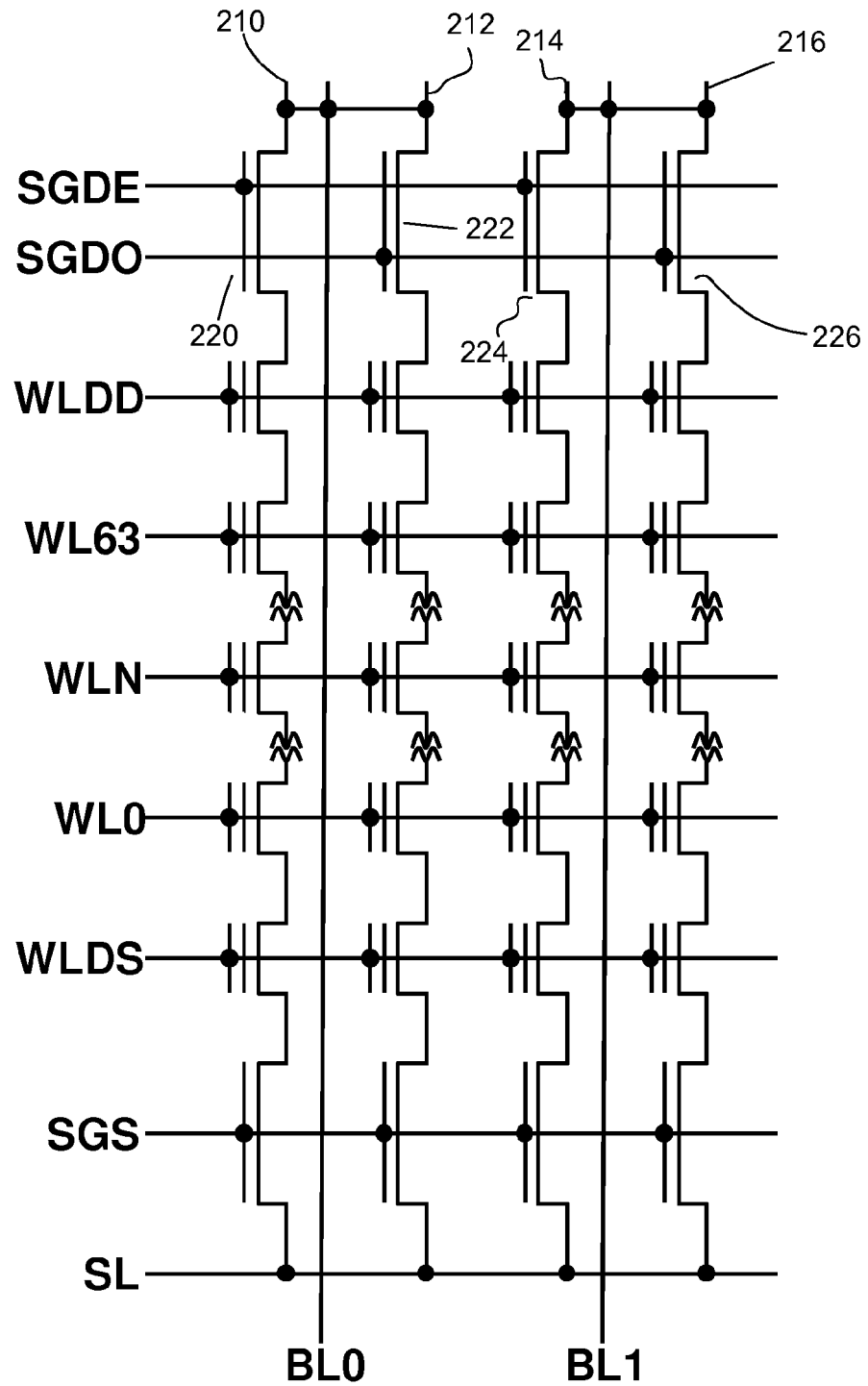
FIG. 4A depicts one embodiment of a non-volatile storage system in which a bit line is shared between two adjacent NAND strings within a memory block.

FIG. 4A depicts one embodiment of a non-volatile storage system in which a bit line is shared between two adjacent NAND strings within a memory block. As depicted, the non-volatile storage system includes four NAND strings (i.e., two pairs of NAND strings corresponding with bit lines BL0 and BL1). Each NAND string includes 64 memory cells corresponding with word lines WL0-WL63. There are two dummy memory cells corresponding with word lines WLDS and WLDD, one on each side of the 64 memory cells. In other embodiments, more than or less than 64 memory cells may be included within a NAND string. The non-volatile storage system includes two drain side selection signals SGDE and SGDO and two bit lines BL0 and BL1. Bit line BL0 is connected to NAND string 210 and NAND string 212. Bit line BL1 is connected to NAND string 214 and NAND string 216. The drain side selection signal SGDE is used to select or unselect NAND string 210 and NAND string 214. The drain side signal SGDO is used to select or unselect NAND string 212 and NAND string 216. Each NAND string only includes one drain side selection gate, implemented as a single transistor. For example, NAND string 210 includes drain side selection gate 220, NAND string 212 includes drain side selection gate 222, NAND string 214 includes drain side selection gate 224, and NAND string 216 includes drain side selection gate 226. Drain side selection signal line SGDE is in communication with selection gate 210 and selection gate 214. Drain side selection signal SGDO is in communication with selection gate 222 and selection gate 226. Each NAND string is in communication with a source line SL via a source select gate controlled by source side selection signal SGS.

Figure 4B:
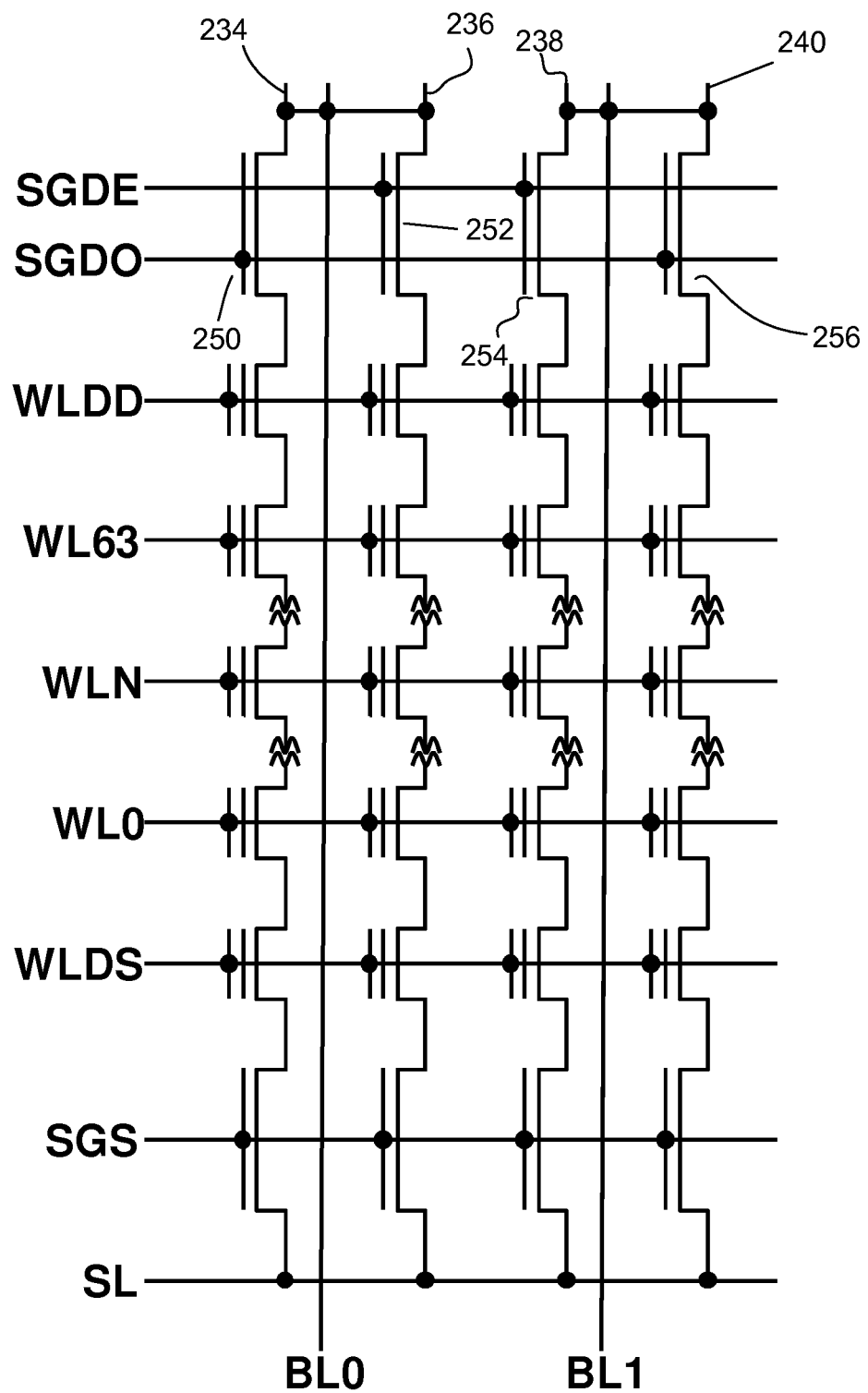
FIG. 4B depicts an alternative embodiment of a non-volatile storage system in which a bit line is shared between two adjacent NAND strings.

FIG. 4B depicts an alternative embodiment of a non-volatile storage system in which a bit line is shared between two adjacent NAND strings. As depicted, the non-volatile storage system includes four NAND strings (i.e., two pairs of NAND strings corresponding with bit lines BL0 and BL1). The non-volatile storage system includes two drain side selection signals SGDE and SGDO and two bit lines BL0 and BL1. Bit line BL0 is connected to and shared by NAND string 234 and NAND string 236. Bit line BL1 is connected to and shared by NAND string 238 and NAND string 240. The drain side selection signal SGDE is in communication with selection gate 252 and selection gate 254. The drain side selection signal SGDO is in communication with selection gate 250 and selection gate 256. Each NAND string is in communication with a source line SL via a source select gate controlled by source side selection signal SGS. A difference between the embodiments of FIG. 4A and FIG. 4B is that the embodiment of FIG. 4A alternates the connections of the drain side select signals such that every other NAND string has its drain side selection gate in communication with the same drain side selection signal while the embodiment of FIG. 4B has adjacent pairs of NAND strings in communication with the same drain side selection signal.

Figure 5:
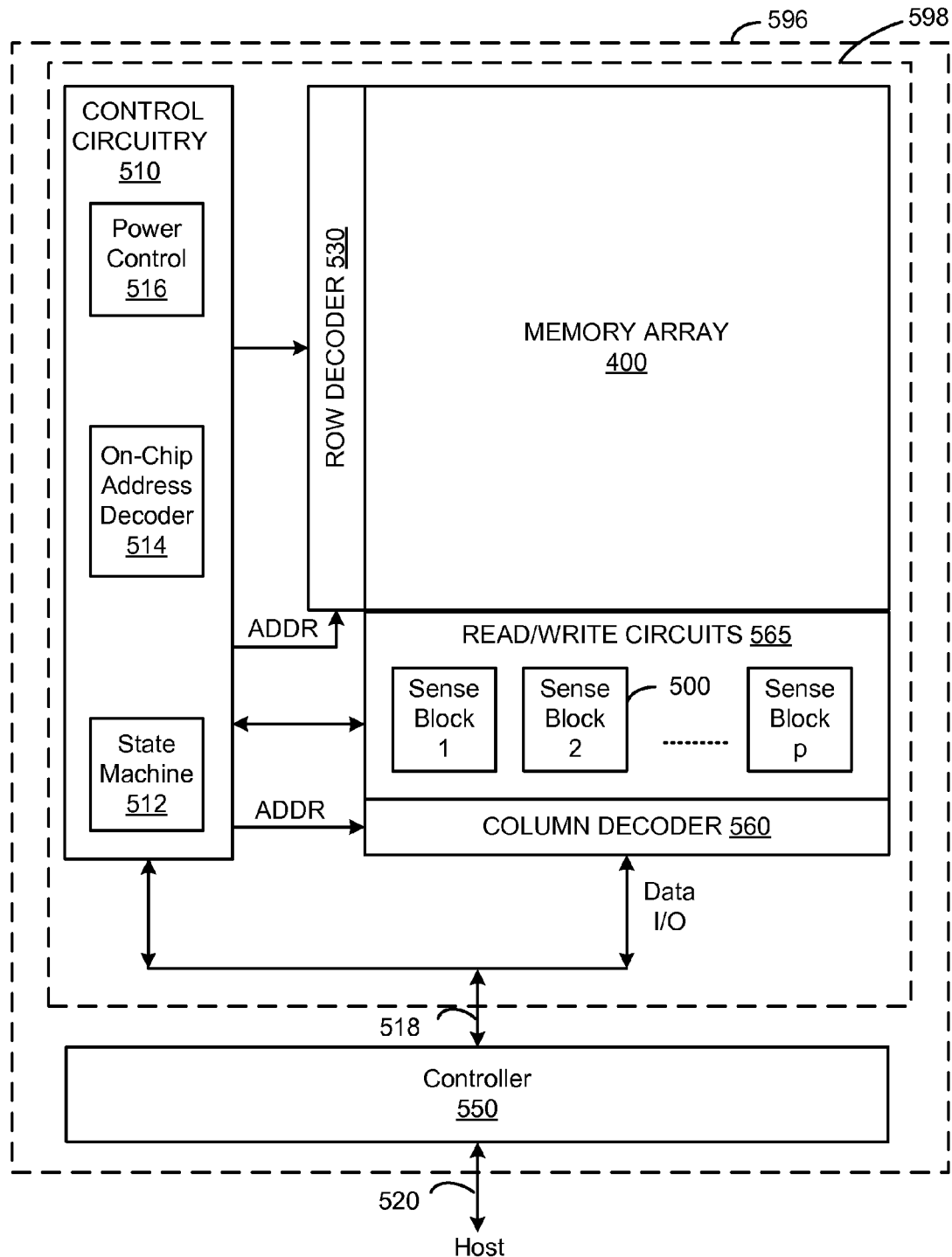
FIG. 5 depicts one embodiment of a non-volatile storage system.

FIG. 5 depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 400 (e.g., a NAND flash memory array), control circuitry 510, row decoder 530, column decoder 560, and read/write circuits 565. In one embodiment, access to the memory array 400 by the various peripheral circuits (e.g., row decoders or column decoders) is implemented in a symmetric fashion, on opposite sides of the array, so that the densities of access lines and circuitry on each side are reduced by half. The memory array 400 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

The control circuitry 510 cooperates with the read/write circuits 565 to perform memory operations on the memory array 400. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations. In one embodiment, a power control module 516 includes one or more charge pumps that can create voltages larger than the supply voltage.

In some embodiments, one or more of the components (alone or in combination), other than memory array 400, may be referred to as a managing or control circuit. For example, one or more managing or control circuits may include any one of or a combination of control circuitry 510, state machine 512, decoders 530/560, power control 516, sense blocks 500, read/write circuits 565, controller 550, and so forth. The one or more managing circuits may perform or facilitate one or more memory array operations including erasing, programming, or reading operations.

In one embodiment, memory array 400 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 6:
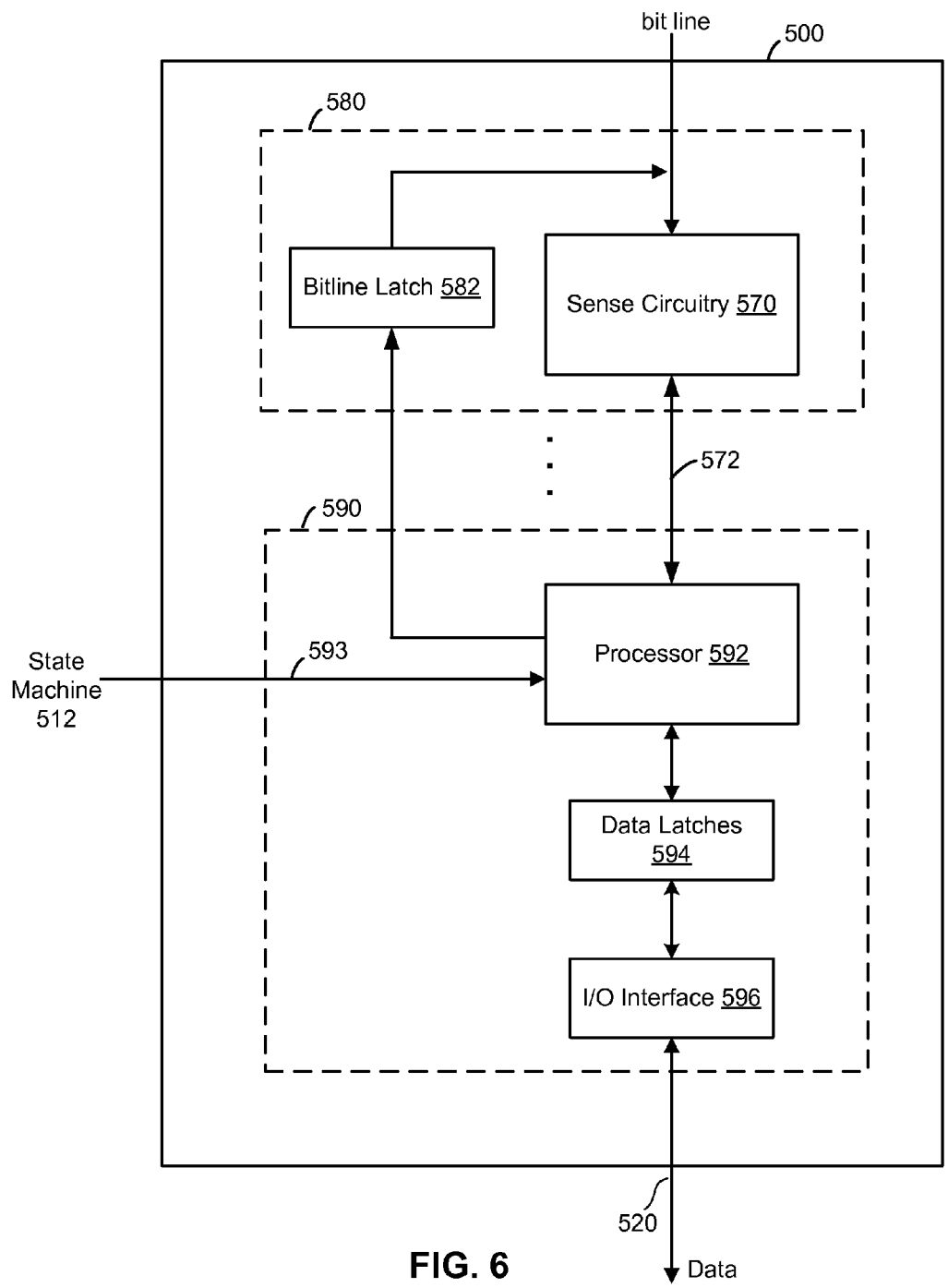
FIG. 6 depicts one embodiment of a sense block.

FIG. 6 depicts one embodiment of a sense block 500, such as sense block 500 in FIG. 5. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 400 in FIG. 5. I/O interface 596 provides an interface between data latches 594 and the data bus 520.

During a read operation or other storage element sensing operation, a state machine, such as state machine 512 in FIG. 5, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 7A:
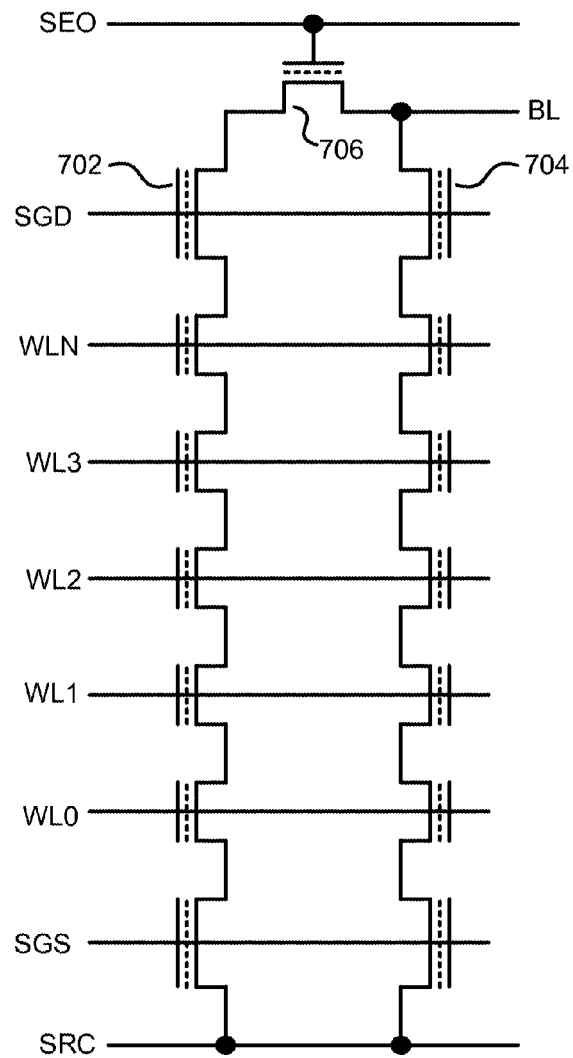
FIG. 7A depicts one embodiment of a pair of strings.

FIG. 7A depicts one embodiment of a pair of strings. The pair of strings (or string pair) may comprise a first string corresponding with a first select gate 702 and a second string corresponding with second select gate 704. The first string and the second string may include source-side select transistors controlled by the SGS line for connecting the first string and the second string to the source line SRC. In one embodiment, the first string may comprise an odd string (or an odd numbered string) and the second string may comprise an even string (or an even numbered string) in a memory block in which the layout of odd and even bit lines are interdigitated. As depicted, a transistor 706 selectively connects the first string to the second string. The transistor 706 may be used to connect the first string corresponding with the first select gate 702 to the shared bit line BL or to isolate the first string from the shared bit line BL. The transistor 706 may be referred to as a selection even/odd string transistor (or SEO transistor).

In some embodiments, each transistor in the first string including the first select gate 702 (controlled by the SGD line), memory cell transistors (corresponding with word lines WL0-WLN), and source-side select transistor (controlled by the SGS line) may comprise the same transistor structure. In one example, the transistor structure may correspond with transistors including a charge storage layer. The charge storage layer may be conductive (e.g., a polysilicon layer as used in a floating gate device) or non-conductive (e.g., a silicon nitride layer as used in a SONOS device). In some embodiments, the selection of one of the memory cells in the first string of the pair of strings may include setting the SEO transistor into a conducting state and setting the SGD line to a voltage that is greater than a first threshold voltage associated with the first select gate 702 of the first string and less than a second threshold voltage associated with the second select gate 704 of the second string of the pair of strings. Applying a voltage to the SGD line that is between the threshold voltages of the first select gate 702 and the second select gate 704 may place the first select gate 702 into a conducting state and the second select gate 704 into a non-conducting state. In one example, if the threshold voltages of the SEO transistor, the first select gate 702, and the second select gate 704 are 2V, 1V, and 3V, respectively, then the first string may be selected by setting the SEO transistor into a conducting state by applying 3V to the SEO line and setting the SGD line to 2V. With these threshold voltages, the second string may be selected and the first string may be deselected by setting the SEO transistor into a non-conducting state by applying 0V to the SEO line and setting the SGD line to 4V. In another example, if the threshold voltages of the SEO transistor, the first select gate 702, and the second select gate 704 are 1V, 1V, and 3V, respectively, then the first string may be selected by setting the SEO transistor into a conducting state by applying 2V to the SEO line and setting the SGD line to 2V. With these threshold voltages, the second string may be selected and the first string may be deselected by setting the SEO transistor into a non-conducting state by applying 0V to the SEO line and setting the SGD line to 4V.

FIG. 7B depicts one embodiment of a shared bit line string architecture including a first pair of strings and a second pair of strings. The first pair of strings may be selectively connected to each other via SEO transistor 712. The first pair of strings may share a common bit line $BL_N$ and a common drain-side selection signal $SGD_N$. The first pair of strings and SEO transistor 712 may be part of a first memory block $BLK_N$. The second pair of strings may be selectively connected to each other via SEO transistor 714. The second pair of strings may share a common bit line $BL_{N+1}$ and a common drain-side selection signal $SGD_{N+1}$. The second pair of strings and SEO transistor 714 may be part of a second memory block $BLK_{N+1}$. The SEO transistor 712 and the SEO transistor 714 may share a common gate signal SEO.

In some embodiments, the first pair of strings may comprise a first string corresponding with a first select gate 715 and a second string corresponding with a second select gate 716. In one embodiment, the first string may comprise an odd string (related to an odd numbered string) and the second string may comprise an even string (related to an even numbered string) in which the layout of odd and even bit lines are interdigitated.

In one embodiment, the selection of one of the memory cells in the first string may include setting the SEO transistor 712 into a conducting state and setting the $SGD_N$ line to a voltage that is greater than a first threshold voltage associated with the first select gate 715 of the first string and less than a second threshold voltage associated with the second select gate 716 of the second string. In this case, a selected memory cell in the first string may be programmed by applying a programming voltage to a selected word line corresponding with the selected memory cell. The selected memory cell in the first string may be sensed (or read) by applying a read voltage to the selected word line corresponding with the selected memory cell.

In one embodiment, the selection of one of the memory cells in the second string may include setting the SEO transistor 712 into a non-conducting state and setting the $SGD_N$ line to a voltage that is greater than the first threshold voltage associated with the first select gate 715 and greater than the second threshold voltage associated with the second select gate 716. In this case, a selected memory cell in the second string may be programmed by applying a programming voltage to a selected word line corresponding with the selected memory cell. The selected memory cell in the second string may be sensed (or read) by applying a read voltage to the selected word line corresponding with the selected memory cell. In one embodiment, the first select gate 715 may be associated with an odd bit line and the second select gate 716 may be associated with an even bit line that is physically adjacent to the odd bit line.

FIG. 7C depicts one embodiment of a portion of a physical layout for the shared bit line string architecture depicted in FIG. 7B. As depicted, the portion of the physical layout includes a first masking layer 727 associated with a diffusion layer and a second masking layer 728 associated with a polysilicon layer. The SEO transistor 712 of FIG. 7B may correspond with the overlap 722 of the polysilicon layer over the diffusion layer and the SEO transistor 714 of FIG. 7B may correspond with the overlap 724 of the polysilicon layer over the diffusion layer. The first select gate 715 of FIG. 7B may correspond with the overlap 717 of the polysilicon layer over the diffusion layer. The bit line $BL_N$ corresponding with the first pair of strings may connect to the first pair of strings via bit line contact 726.

FIG. 8A depicts one embodiment of a shared bit line string architecture including a first pair of strings and a second pair of strings. The first pair of strings may be selectively connected to each other via SEO transistor 802. The first pair of strings may share a common bit line $BL_N$ and a common drain-side selection signal $SGD_N$. The first pair of strings and a portion of SEO transistor 802 may be part of a first memory block $BLK_N$. As depicted, the second pair of strings may also be selectively connected to each other via SEO transistor 802. The second pair of strings may share the common bit line $BL_N$ and a common drain-side selection signal $SGD_{N+1}$. The second pair of strings and a portion of SEO transistor 802 may be part of a second memory block $BLK_{N+1}$. The SEO transistor 802 may be controlled by a gate signal SEO. In one embodiment, the SEO transistor 802 may comprise a single gate-controlled device including four source/drain junctions.

In some embodiments, the first pair of strings may comprise a first string corresponding with a first select gate 815 and a second string corresponding with a second select gate 816. In one embodiment, the first string may comprise an odd string (related to an odd numbered string) and the second string may comprise an even string (related to an even numbered string) in which the layout of odd and even bit lines is interdigitated.

In one embodiment, the selection of one of the memory cells in the first string may include setting the SEO transistor 802 into a conducting state and setting the $SGD_N$ line to a voltage that is greater than a first threshold voltage associated with the first select gate 815 of the first string and less than a second threshold voltage associated with the second select gate 816 of the second string. In this case, a selected memory cell in the first string may be programmed by applying a programming voltage to a selected word line corresponding with the selected memory cell. The selected memory cell in the first string may be sensed (or read) by applying a read voltage to the selected word line corresponding with the selected memory cell.

As the SEO transistor 802 is shared by both the first pair of strings and the second pair of strings (i.e., the SEO transistor 802 may be used to control strings in both $BLK_N$ and $BLK_{N+1}$), when a memory cell in the first pair of strings is being selected, the $SGD_{N+1}$ selection signal may be set to ground (or another disabling voltage) to prevent selection of memory cells in the second pair of strings and to isolate the memory cells of the second pair of strings from voltages applied to the common bit line $BL_N$.

In one embodiment, the selection of one of the memory cells in the second string may include setting the SEO transistor 802 into a non-conducting state and setting the $SGD_N$ line to a voltage that is greater than the first threshold voltage associated with the first select gate 815 and greater than the second threshold voltage associated with the second select gate 816. In this case, a selected memory cell in the second string may be programmed by applying a programming voltage to a selected word line corresponding with the selected memory cell. The selected memory cell in the second string may be sensed (or read) by applying a read voltage to the selected word line corresponding with the selected memory cell. In one embodiment, the first select gate 815 may be associated with an odd bit line and the second select gate 816 may be associated with an even bit line that is physically adjacent to the odd bit line.

As the SEO transistor 802 is shared by both the first pair of strings and the second pair of strings (i.e., may be used to control strings in both $BLK_N$ and $BLK_{N+1}$), when a memory cell in the second pair of strings is being selected, the $SGD_N$ selection signal may be set to ground (or another disabling voltage) to prevent selection of memory cells in the first pair of strings and to isolate the memory cells of the first pair of strings from voltages applied to the common bit line $BL_N$.

FIG. 8B depicts one embodiment of a portion of a physical layout for the shared bit line string architecture depicted in FIG. 8A. As depicted, the portion of the physical layout includes a first masking layer 827 associated with a diffusion layer and a second masking layer 828 associated with a polysilicon layer. The SEO transistor 802 of FIG. 8A may correspond with the overlap 812 of the polysilicon layer over the diffusion layer. In this case, the SEO transistor 802 comprises a single transistor with four source/drain junctions; the gate of the SEO transistor is connected to the SEO signal line. The first select gate 815 of FIG. 8A may correspond with the overlap 817 of the polysilicon layer over the diffusion layer. The bit line $BL_N$ corresponding with the first pair of strings may connect to the first pair of strings via bit line contact 814.

FIG. 8C depicts another embodiment of a shared bit line string architecture including a first pair of strings and a second pair of strings. The first pair of strings may be selectively connected to each other via SEO transistor 822. The first pair of strings may share a common bit line $BL_N$ and a common drain-side selection signal $SGD_N$. The first pair of strings and SEO transistor 822 may be part of a first memory block $BLK_N$. The second pair of strings may be selectively connected to each other via SEO transistor 824. The second pair of strings may share a common bit line $BL_{N+1}$ and a common drain-side selection signal $SGD_{N+1}$. The second pair of strings and SEO transistor 824 may be part of a second memory block $BLK_{N+1}$. The SEO transistor 822 may be controlled by a first SEO signal SEO1 and the SEO transistor 824 may be controlled by a second SEO signal SEO2.

In some embodiments, the first pair of strings may comprise a first string corresponding with a first select gate 825 and a second string corresponding with a second select gate 826. In one embodiment, the first string may comprise an odd string (related to an odd numbered string) and the second string may comprise an even string (related to an even numbered string) in which the layout of odd and even bit lines is interdigitated.

In one embodiment, the selection of one of the memory cells in the first string may include setting the SEO transistor 822 into a conducting state and setting the $SGD_N$ line to a voltage that is greater than a first threshold voltage associated with the first select gate 825 of the first string and less than a second threshold voltage associated with the second select gate 826 of the second string. In this case, a selected memory cell in the first string may be programmed by applying a programming voltage to a selected word line corresponding with the selected memory cell. The selected memory cell in the first string may be sensed (or read) by applying a read voltage to the selected word line corresponding with the selected memory cell.

In one embodiment, the selection of one of the memory cells in the second string may include setting the SEO transistor 822 into a non-conducting state and setting the $SGD_N$ line to a voltage that is greater than the first threshold voltage associated with the first select gate 825 and greater than the second threshold voltage associated with the second select gate 826. In this case, a selected memory cell in the second string may be programmed by applying a programming voltage to a selected word line corresponding with the selected memory cell. The selected memory cell in the second string may be sensed (or read) by applying a read voltage to the selected word line corresponding with the selected memory cell. In one embodiment, the first select gate 825 may be associated with an odd bit line and the second select gate 826 may be associated with an even bit line that is physically adjacent to the odd bit line.

In one embodiment, when a selected memory cell associated with the second string of the first pair of strings is selected for reading or programming and the SEO transistor 822 is cut-off or set into a non-conducting state, then a second memory cell associated with either one of the strings of the second pair of strings (e.g., either the odd string or the even string) may also be selected for reading or programming at the same time. Thus, the shared bit line string architecture of FIG. 8C allows memory cells in both the first pair of strings and the second pair of strings to be selected at the same time. When a selected memory cell associated with the first string of the first pair of strings is selected for reading or programming and the SEO transistor 822 is set into a conducting state (e.g., the selected memory cell is in the first string which is an odd string of the first pair of strings), then a second memory cell associated with the string of the second pair of strings that is directly connected to bit line $BL_{N+1}$ (e.g., the even string of the second pair of strings) may also be selected for reading or programming at the same time.

FIG. 8D depicts one embodiment of a portion of a physical layout for the shared bit line string architecture depicted in FIG. 8C. As depicted, the portion of the physical layout includes a first masking layer 837 associated with a diffusion layer and a second masking layer 838 associated with a polysilicon layer. The SEO transistor 822 of FIG. 8C may correspond with the overlap 832 of the polysilicon layer over the diffusion layer and the SEO transistor 824 of FIG. 8C may correspond with the overlap 834 of the polysilicon layer over the diffusion layer. The first select gate 825 of FIG. 8C may correspond with the overlap 827 of the polysilicon layer over the diffusion layer. The bit line $BL_N$ corresponding with the first pair of strings may connect to the first pair of strings via bit line contact 836.

Figure 9A:
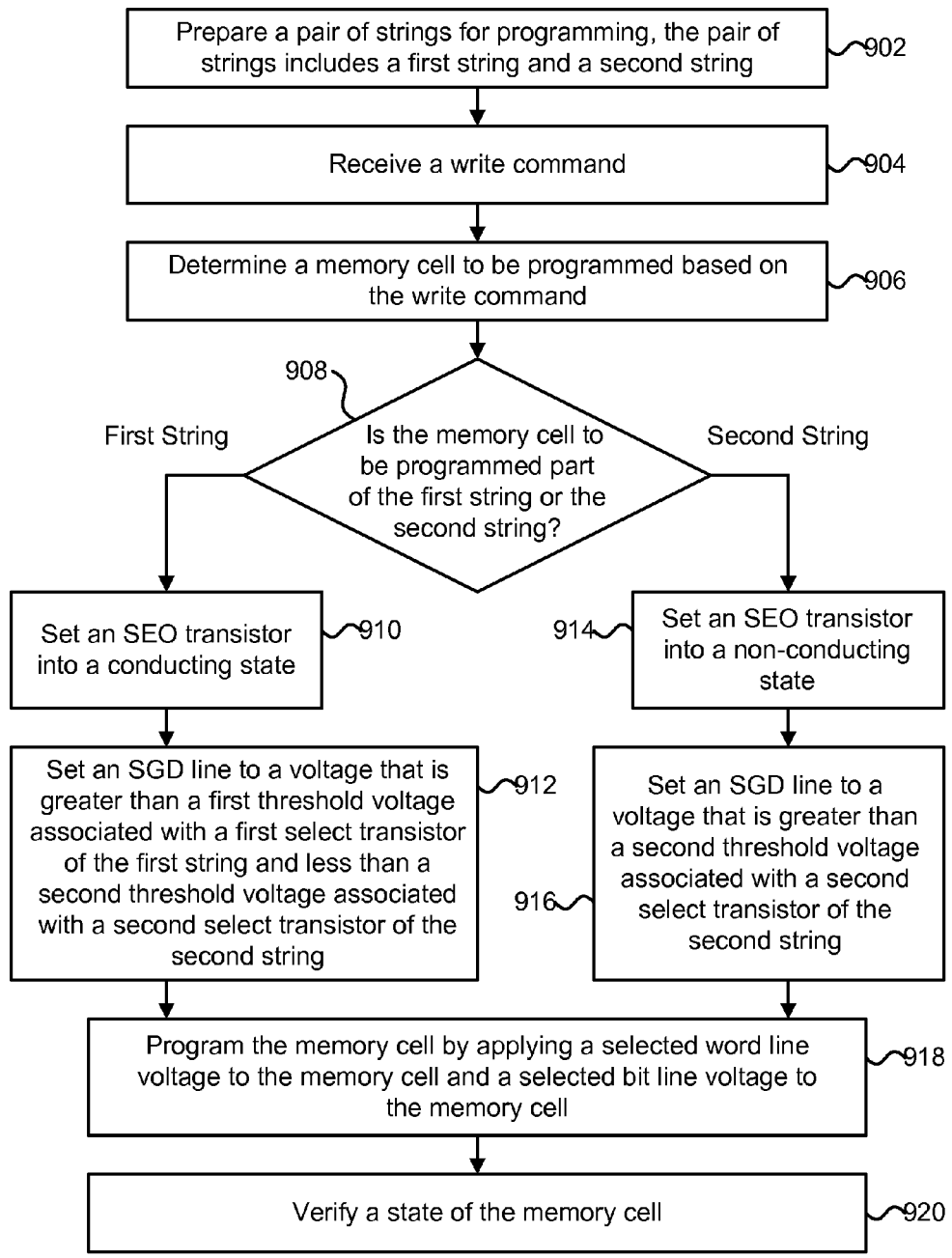
FIG. 9A is a flowchart describing one embodiment of a process for programming one or more memory cells in a shared bit line string architecture.

FIG. 9A is a flowchart describing one embodiment of a process for programming one or more memory cells in a shared bit line string architecture. In one embodiment, the process of FIG. 9A may be performed by a non-volatile storage system, such as non-volatile storage system 596 in FIG. 5.

In step 902, a pair of strings is prepared for programming. The pair of strings may include a first string and a second string. In one example, the first string may correspond with the first string in FIG. 7A associated with the first select gate 702 and the second string may correspond with the second string in FIG. 7A associated with the second select gate 704. In one embodiment, the threshold voltages for the SEO transistor and drain-side select transistors may be initially set by the semiconductor process used for fabricating the devices.

In some embodiments, a first select transistor associated with the first string may be programmed to a first threshold voltage and a second select transistor associated with the second string may be programmed to a second threshold voltage greater than the first threshold voltage. In some cases, the first threshold voltage may comprise a negative threshold voltage and the second threshold voltage may comprise a positive threshold voltage. In another embodiment, the first select transistor associated with the first string may be fabricated such that a particular threshold voltage is given to the first select transistor and the SEO transistor. One embodiment of a process for preparing a pair of strings for programming is described later in reference to FIG. 9B.

In step 904, a write command is received. In one embodiment, the write command (or programming command) may dictate a set of data to be programmed to one or more locations in a non-volatile memory. The write command may be received by a non-volatile storage system, such as non-volatile storage system 596 in FIG. 5. In step 906, a memory cell to be programmed is determined based on the write command. In one embodiment, the memory cell (which may be one of a number of memory cells to be programmed at the same time) may be determined using control circuitry, such as control circuitry 510 in FIG. 5. The memory cell to be programmed may be associated with one string of a pair of strings sharing a common bit line. The pair of strings may comprise a first string and a second string.

In step 908, it is determined whether the memory cell to be programmed is part of the first string or the second string. If the memory cell to be programmed is part of the first string (i.e., the string of a pair of strings that is not directly connected to the shared bit line), then step 910 is performed. Otherwise, if the memory cell to be programmed is part of the second string (i.e., the string of a pair of strings that is directly connected to the shared bit line), then step 914 is performed. In one embodiment, the first string may correspond with a bit line address associated with odd-numbered bit lines and the second string may correspond with a bit line address associated with even-numbered bit lines.

In step 910, an SEO transistor is set into a conducting state. In one example, the SEO transistor may correspond with transistor 706 in FIG. 7A. In step 912, an SGD line is set to a voltage that is greater than a first threshold voltage associated with the first select transistor of the first string and less than a second threshold voltage associated with a second select transistor of the second string. The SGD line may correspond with the gate connection to drain-side select gates. In step 914, an SEO transistor is set into a non-conducting state. In step 916, an SGD line is set to a voltage that is greater than a second threshold voltage associated with a second select transistor of the second string. In some cases, the SGD line may be set to a voltage that is greater than both the first threshold voltage associated with the first select transistor and the second threshold voltage associated with the second select transistor.

In step 918, the memory cell is programmed by applying a selected word line voltage to the memory cell and a selected bit line voltage to the memory cell. In this case, the memory cell may be programmed by applying a programming voltage to a selected word line corresponding with the selected memory cell. In step 920, a state of the memory cell is verified. One embodiment of a process for reading or verifying a memory cell is described later in reference to FIG. 9C.

Figure 9B:
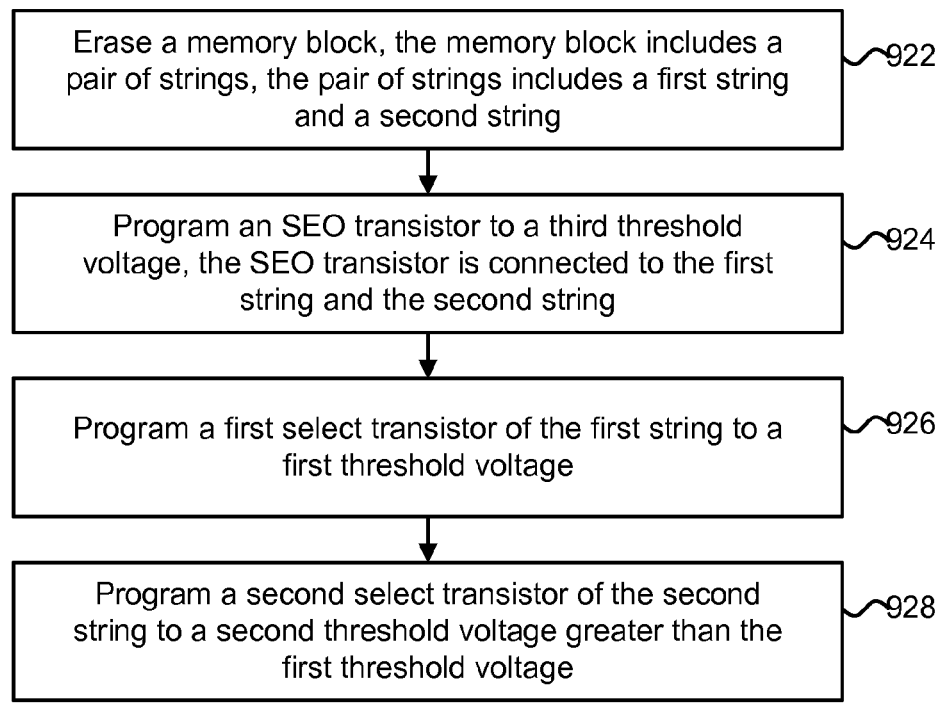
FIG. 9B is a flowchart describing one embodiment of a process for preparing a pair of strings for programming.

FIG. 9B is a flowchart describing one embodiment of a process for preparing a pair of strings for programming. The process described in FIG. 9B is one example of a process for implementing step 902 in FIG. 9A. In one embodiment, the process of FIG. 9B may be performed by a non-volatile storage system, such as non-volatile storage system 596 in FIG. 5.

In step 922, a memory block including a pair of strings is erased. The pair of strings may include a first string and a second string. In step 924, an SEO transistor is programmed to a third threshold voltage. The SEO transistor may be connected to the first string and the second string. The SEO transistor may selectively couple (e.g., based on its gate voltage) a shared bit line common to both the first string and the second string to the first string. In one embodiment, the SEO transistor may be programmed to the third threshold voltage by applying a programming voltage to the gate of the SEO transistor, grounding the shared bit line, and setting a drain-side select line (e.g., an SGD line) to ground (or another voltage that prevents memory cells in the first string and the second string from being selected). The third threshold voltage may be different from the threshold voltages used with drain-side select gates of the pair of strings.

In step 926, a first select transistor of the first string is programmed to a first threshold voltage. In one embodiment, both the first select transistor and a second select transistor of the second string may be programmed to the first threshold voltage. In one example, the SEO transistor may be set into a conducting state while a programming voltage is applied to the drain-side select line common to drain-side select gates in the first string and the second string. In step 928, a second select transistor of the second string is programmed to a second threshold voltage greater than the first threshold voltage. In one embodiment, the second select transistor may be programmed to the second threshold voltage by setting the SEO transistor into a non-conducting state and applying a programming voltage to the drain-side select line common to drain-side select gates in the first string and the second string.

Figure 9C:
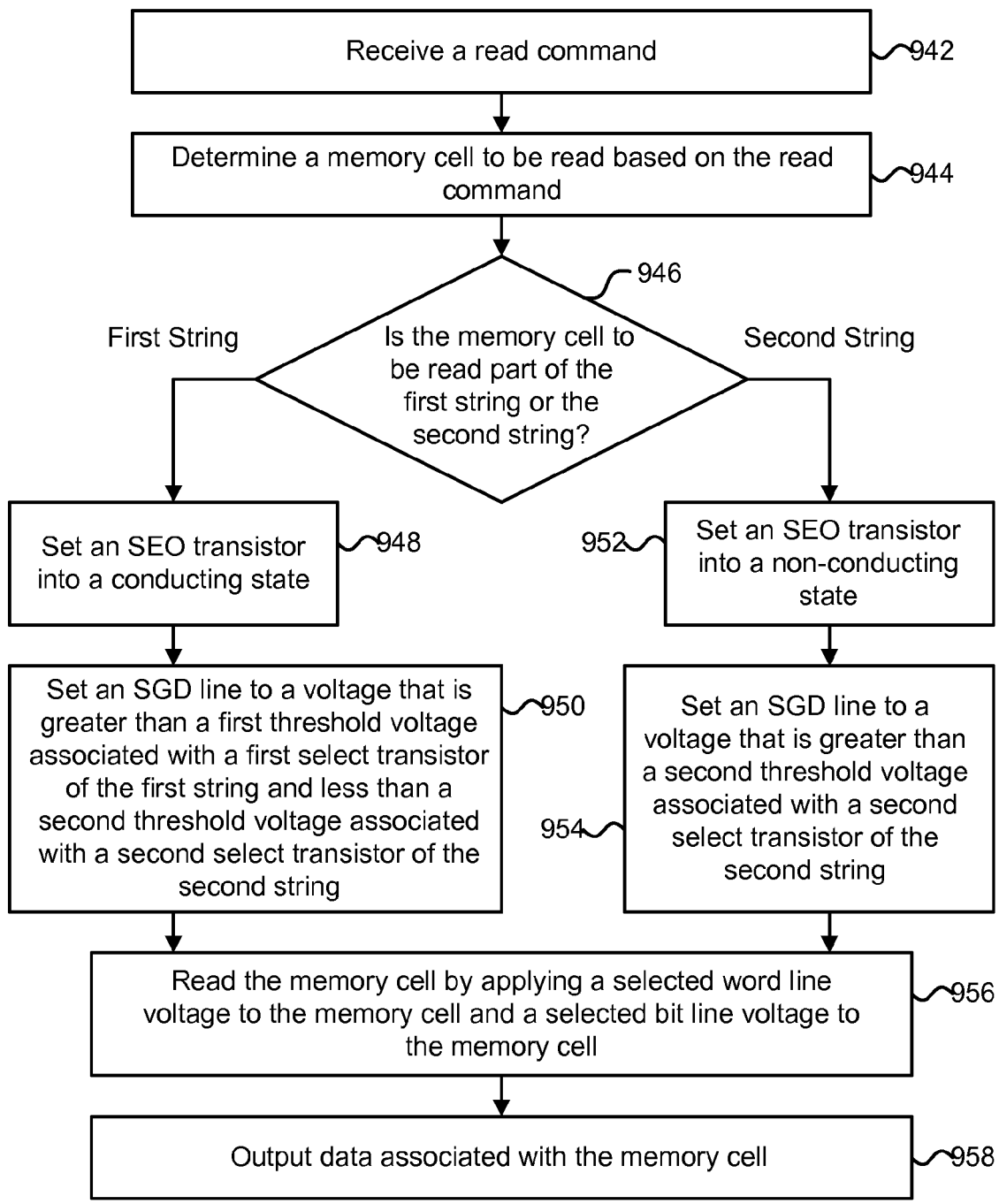
FIG. 9C is a flowchart describing one embodiment of a process for reading one or more memory cells in a shared bit line string architecture.

FIG. 9C is a flowchart describing one embodiment of a process for reading one or more memory cells in a shared bit line string architecture. The process described in FIG. 9C is one example of a process for implementing step 920 in FIG. 9A. In one embodiment, the process of FIG. 9C may be performed by a non-volatile storage system, such as non-volatile storage system 596 in FIG. 5.

In step 942, a read command is received. The read command may be received by a non-volatile storage system, such as non-volatile storage system 596 in FIG. 5. In step 944, a memory cell to be read is determined based on the read command. In one embodiment, the memory cell (which may be one of a number of memory cells to be read at the same time) may be determined using control circuitry, such as control circuitry 510 in FIG. 5. The memory cell to be read may be associated with one string of a pair of strings sharing a common bit line. The pair of strings may comprise a first string and a second string.

In step 946, it is determined whether the memory cell to be read is part of the first string or the second string. If the memory cell to be read is part of the first string (i.e., the string of a pair of strings that is not directly connected to the shared bit line), then step 948 is performed. Otherwise, if the memory cell to be read is part of the second string (i.e., the string of a pair of strings that is directly connected to the shared bit line), then step 952 is performed. In one embodiment, the first string may correspond with a bit line address associated with odd-numbered bit lines and the second string may correspond with a bit line address associated with even-numbered bit lines.

In step 948, an SEO transistor is set into a conducting state. In one example, the SEO transistor may correspond with transistor 706 in FIG. 7A. In step 950, an SGD line is set to a voltage that is greater than a first threshold voltage associated with the first select transistor of the first string and less than a second threshold voltage associated with a second select transistor of the second string. The SGD line may correspond with the gate connection to drain-side select gates. In step 952, an SEO transistor is set into a non-conducting state. In step 954, an SGD line is set to a voltage that is greater than a second threshold voltage associated with a second select transistor of the second string.

In step 956, the memory cell is read by applying a selected word line voltage to the memory cell and a selected bit line voltage to the memory cell. In this case, the memory cell may be read by applying a read voltage to a selected word line corresponding with the selected memory cell. In step 958, data associated with the memory cell is outputted.

One embodiment of the disclosed technology includes determining that a memory cell is associated with a first string of a pair of strings. The pair of strings includes the first string and a second string. The first string includes a first select transistor with a first threshold voltage and the second string includes a second select transistor with a second threshold voltage different from the first threshold voltage. The first select transistor and the second select transistor are connected to a drain-side select line. The method further comprises setting an SEO transistor into a conducting state. The SEO transistor is connected to the first string and the second string. The method further comprises performing an operation on the memory cell. The operation may comprise a read or programming operation.

One embodiment of the disclosed technology includes a non-volatile storage system including a semiconductor memory array and one or more managing circuits in communication with the semiconductor memory array. The semiconductor memory array includes a pair of strings. The pair of strings includes a first string and a second string. The first string includes a first select transistor associated with a first threshold voltage and the second string includes a second select transistor associated with a second threshold voltage different from the first threshold voltage. The first select transistor and the second select transistor are connected to a drain-side select line. The one or more managing circuits determine that a memory cell is associated with the first string of the pair of strings and cause an SEO transistor to be set into a conducting state. The SEO transistor is connected to the first string and the second string. The one or more managing circuits cause the drain-side select line to be set to a voltage that is greater than the first threshold voltage and less than the second threshold voltage. The one or more managing circuits cause an operation to be performed on the memory cell subsequent to setting the SEO transistor into the conducting state.

One embodiment of the disclosed technology includes acquiring a command and determining a memory cell to be operated on based on the command. The memory cell is associated with a first string of a pair of strings. The pair of strings includes the first string and a second string. The first string includes a first select transistor associated with a first threshold voltage and the second string includes a second select transistor associated with a second threshold voltage. The first select transistor and the second select transistor are controlled by a drain-side select line. The method further comprises setting an SEO transistor into a conducting state. The SEO transistor is connected to the first select transistor and the second select transistor. The method further comprises setting the drain-side select line to a voltage that is greater than the first threshold voltage and less than the second threshold voltage and performing an operation on the memory cell subsequent to the setting the drain-side select line.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" are used to described different embodiments and do not necessarily refer to the same embodiment.

For purposes of this document, a connection can be a direct connection or an indirect connection (e.g., via another part). The use of the terms coupled and connected may refer to a direct connection or an indirect connection.

For purposes of this document, the term "set" of objects, refers to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for operating a shared bit line string architecture, comprising:
   setting a selection even/odd string transistor into a conducting state, the selection even/odd string transistor is connected between a first string and a second string, the first string includes a first select transistor with a first threshold voltage, the second string includes a second select transistor with a second threshold voltage greater than the first threshold voltage, the first select transistor and the second select transistor are controlled by a drain-side select line, the first string includes a memory cell, the second select transistor includes a drain that is directly connected to a shared bit line, the selection even/odd string transistor is connected to the shared bit line and the first select transistor;
   setting the drain-side select line to a voltage that is greater than the first threshold voltage and less than the second threshold voltage; and
   performing an operation on the memory cell subsequent to the setting a selection even/odd string transistor into a conducting state.

2. The method of claim 1, wherein:
   the first select transistor includes a first drain, the selection even/odd string transistor is connected to the first drain and the drain of the second select transistor.

3. The method of claim 1, wherein:
   the performing an operation includes applying a selected word line voltage to the memory cell and a selected bit line voltage to the shared bit line, the operation comprises a programming operation, the selected word line voltage corresponds with a programming voltage.

4. The method of claim 1, further comprising:
   preparing the pair of strings for programming prior to the setting a selection even/odd string transistor into a conducting state.

5. The method of claim 4, wherein:
   the preparing the pair of strings for programming includes programming the selection even/odd string transistor to a third threshold voltage greater than the first threshold voltage, programming the first select transistor to the first threshold voltage, and programming the second select transistor to the second threshold voltage.

6. The method of claim 5, wherein:
   the third threshold voltage is different from the second threshold voltage.

7. The method of claim 1, wherein:
   the selection even/odd string transistor comprises a single gate-controlled device including more than two source/drain junctions.

8. The method of claim 1, wherein:
   the memory cell comprises a transistor including a charge storage layer.

9. The method of claim 8, wherein:
   the charge storage layer comprises a layer of silicon nitride.

10. The method of claim 1, wherein:
    the first string is associated with an odd bit line of a plurality of odd bit lines and the second string is associated with an even bit line of a plurality of even bit lines, the plurality of odd bit lines and the plurality of even bit lines are interdigitated.

11. A non-volatile storage system, comprising:
    a semiconductor memory array, the semiconductor memory array includes a pair of strings and a string selection transistor, the pair of strings includes a first string and a second string, the first string includes a first select transistor with a first threshold voltage, the second string includes a second select transistor with a second threshold voltage greater than the first threshold voltage, the first select transistor and the second select transistor are controlled by a drain-side select line, the first string includes a memory cell, the second select transistor includes a drain that is directly connected to a shared bit line, the string selection transistor is connected to the shared bit line and the first select transistor; and
    one or more managing circuits in communication with the semiconductor memory array, the one or more managing circuits cause the string selection transistor to be set into a conducting state, the one or more managing circuits cause the drain-side select line to be set to a voltage that is greater than the first threshold voltage and less than the second threshold voltage, the one or more managing circuits cause an operation to be performed on the memory cell subsequent to setting the string selection transistor into the conducting state.

12. The non-volatile storage system of claim 11, wherein:
    the operation comprises a programming operation that includes applying a selected bit line voltage to the shared bit line.

13. The non-volatile storage system of claim 11, wherein:
    the one or more managing circuits cause the first select transistor to be programmed to the first threshold voltage and the second select transistor to be programmed to the second threshold voltage prior to setting the string selection transistor into the conducting state.

14. The non-volatile storage system of claim 11, wherein:
    the string selection transistor comprises a gate-controlled device including more than two source/drain junctions.

15. The non-volatile storage system of claim 11, wherein:
    the memory cell comprises a transistor including a charge storage layer.

16. The non-volatile storage system of claim 15, wherein:
    the charge storage layer comprises a layer of silicon nitride.

17. A method for operating a shared bit line string architecture, comprising:
    acquiring a command;
    determining a memory cell to be operated on based on the command, the memory cell is associated with a first string of a pair of strings, the pair of strings includes the first string and a second string, the first string includes a first select transistor associated with a first threshold voltage, the second string includes a second select transistor associated with a second threshold voltage, the first select transistor and the second select transistor are controlled by a drain-side select line;

setting a selection even/odd string transistor into a conducting state, the selection even/odd string transistor is connected to the first select transistor and the second select transistor, the selection even/odd string transistor comprises a single gate-controlled device including more than two source/drain junctions;

setting the drain-side select line to a voltage that is greater than the first threshold voltage and less than the second threshold voltage; and performing an operation on the memory cell subsequent to the setting the drain-side select line.

18. The method of claim 17, wherein:
the operation comprises a programming operation.

19. The method of claim 18, further comprising:
preparing the pair of strings for programming prior to the setting a selection even/odd string transistor into a conducting state, the preparing the pair of strings for programming includes programming the selection even/odd string transistor to the first threshold voltage, programming the first select transistor to the first threshold voltage, and programming the second select transistor to the second threshold voltage.

20. The method of claim 19, wherein:
the memory cell comprises a transistor including a charge storage layer.

* * * * *